United States Patent [19]

Brown

[11] Patent Number: 4,640,010

[45] Date of Patent: Feb. 3, 1987

[54] METHOD OF MAKING A PACKAGE UTILIZING A SELF-ALIGNING PHOTOEXPOSURE PROCESS

[75] Inventor: Candice H. Brown, San Jose, Calif.

[73] Assignee: Advanced Micro Devices, Inc., Sunnyvale, Calif.

[21] Appl. No.: 728,053

[22] Filed: Apr. 29, 1985

[51] Int. Cl.⁴ .............................................. H05K 3/30
[52] U.S. Cl. ...................................... 29/832; 29/840; 174/16 HS; 357/81
[58] Field of Search ......................... 29/830, 832, 840; 174/16 HS, 52 PE, 68.5; 357/80, 81

[56] References Cited

U.S. PATENT DOCUMENTS 3,885,304  5/1975  Kaiser et al. ........................... 29/832
3,916,434  10/1975  Garboushian .................... 357/81 X
4,445,274  5/1984  Suzuki et al. ...................... 29/830 X

*Primary Examiner*—Howard N. Goldberg
*Assistant Examiner*—Carl J. Arbes
*Attorney, Agent, or Firm*—Patrick T. King; Eugene H. Valet; J. Vincent Tortolano

[57] ABSTRACT

The invention discloses an improved PC board package for one or more integrated circuit dies comprising a plurality of PC boards bonded together to form a composite. The composite has at least one cavity, for mounting of an integrated circuit die, formed in at least one PC board of the composite. The cavity walls are plated to seal off portions of the PC board exposed by formation of the cavity to thereby prevent subsequent outgassing. Heat pipes are formed in a PC board adjacent the PC board with the cavity to conduct heat from an integrated circuit chip mounted in the cavity to an opposite surface of the package.

15 Claims, 10 Drawing Figures

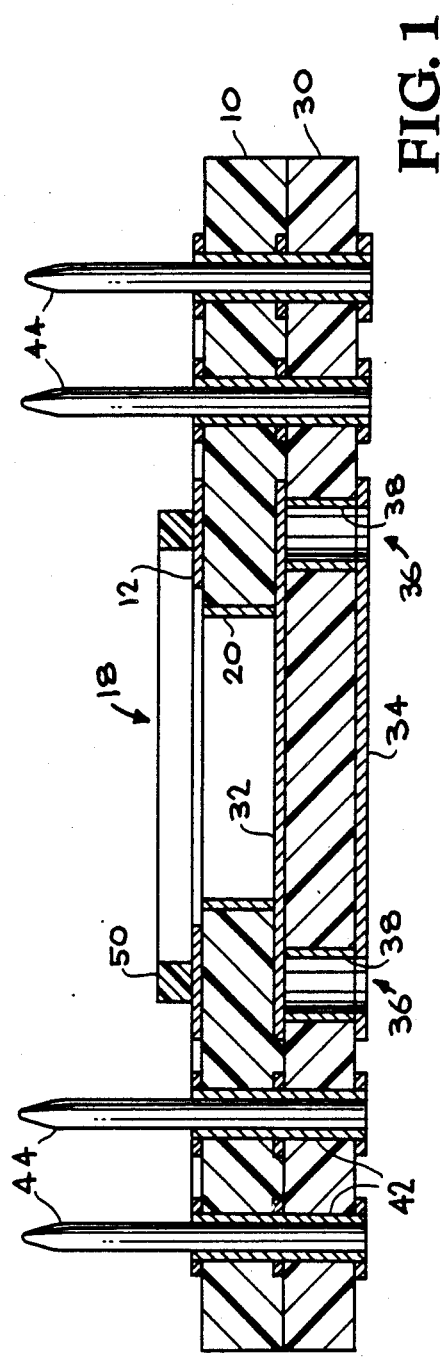
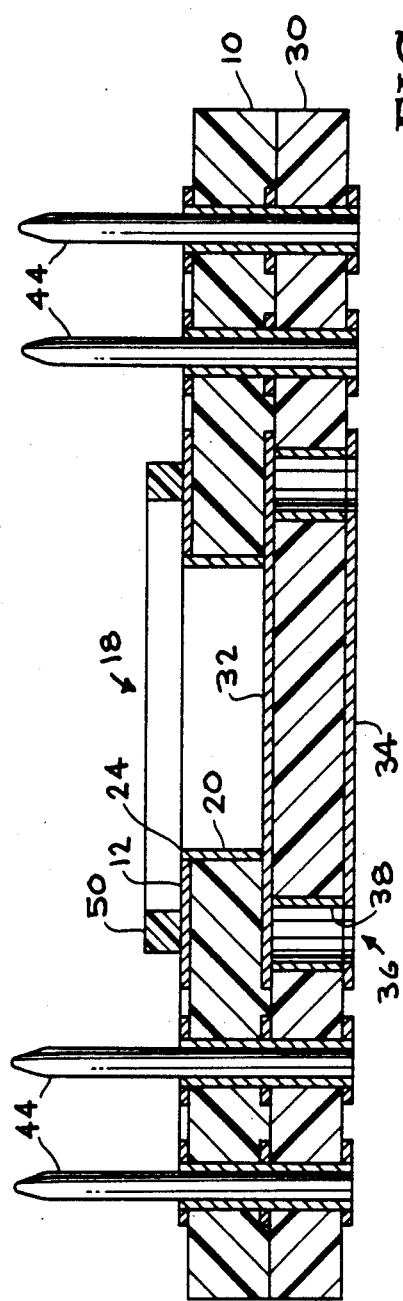
FIG. 1
FIG. 2

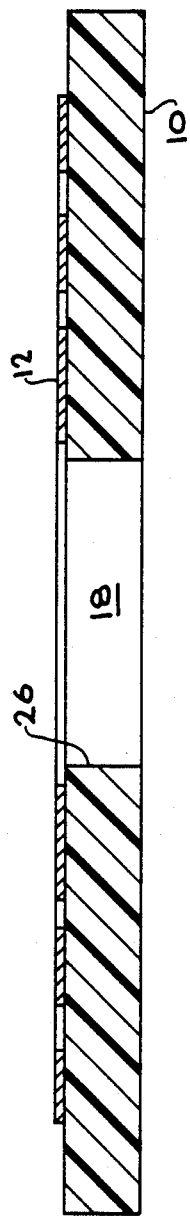
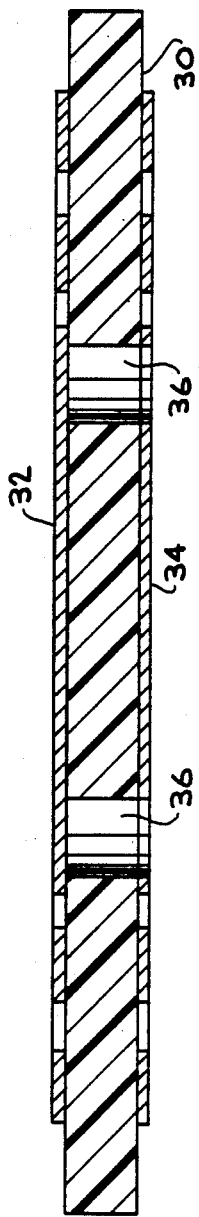
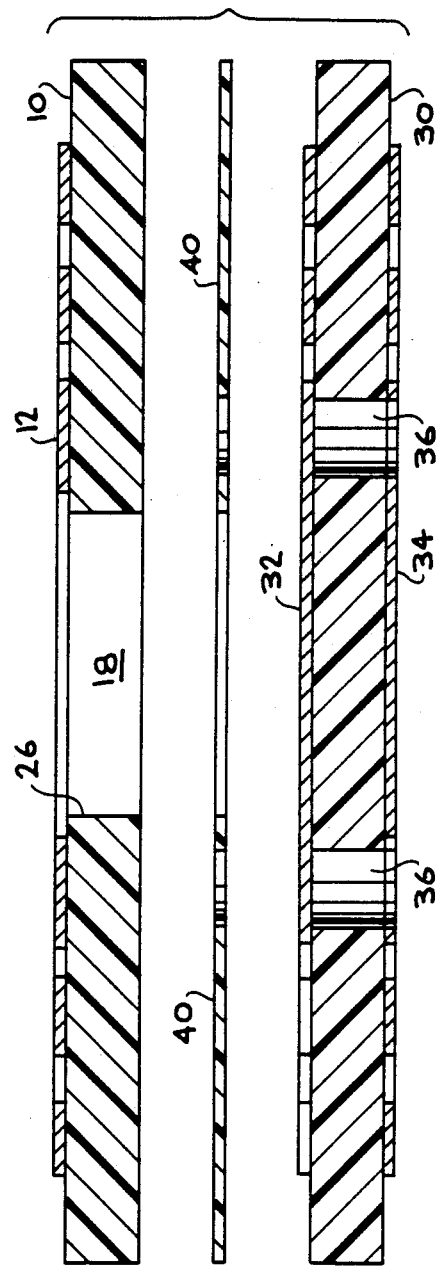

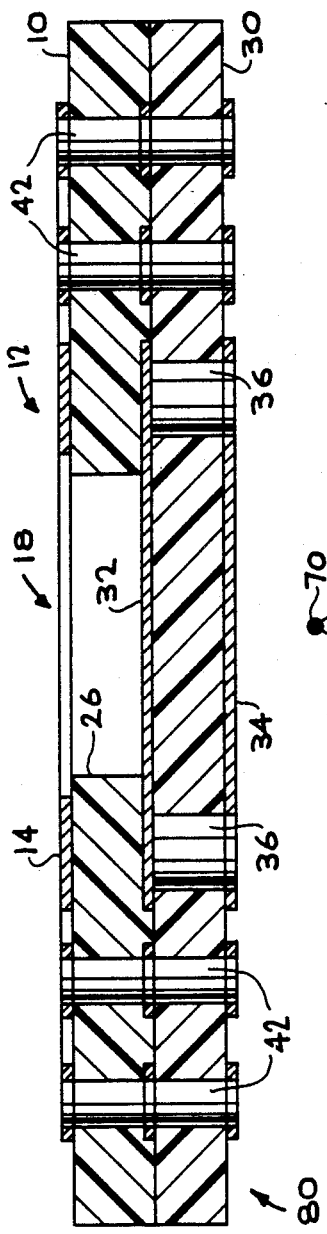
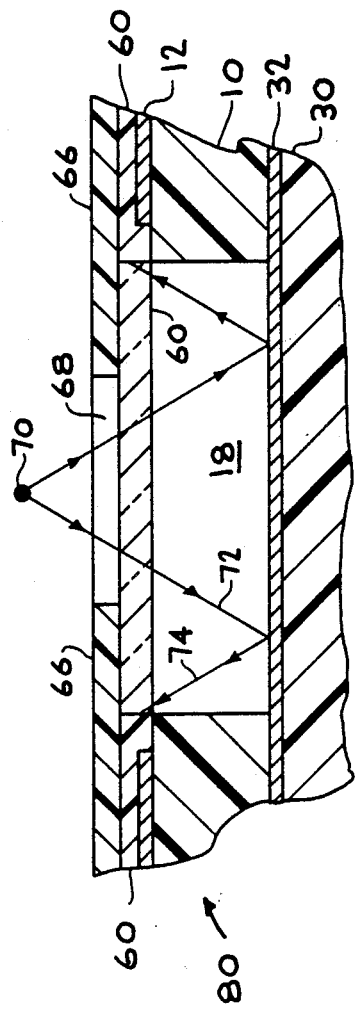
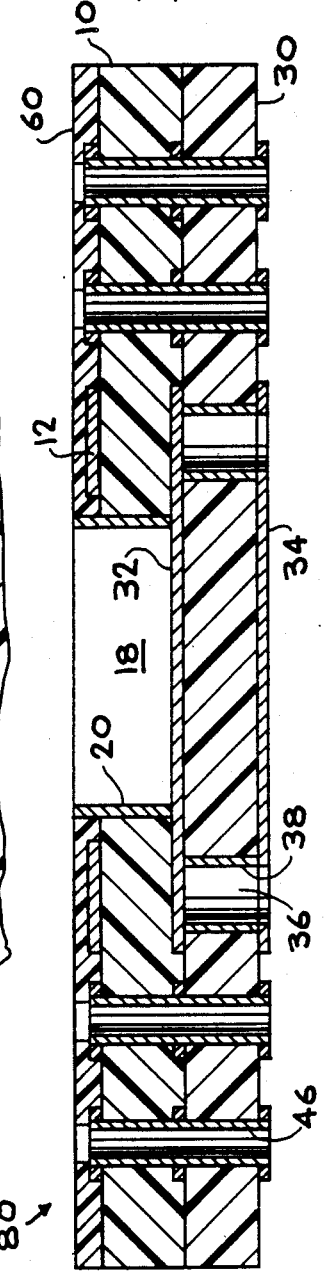

METHOD OF MAKING A PACKAGE UTILIZING A SELF-ALIGNING PHOTOEXPOSURE PROCESS

BACKGROUND OF THE INVENTION

1. Field of the Invention

This invention relates to a package for an integrated circuit device and a method of making same. More particularly, this invention relates to a chip on board multilayer printed circuit board package for an integrated circuit device and a method for making the package utilizing a self-aligning photoexposure process.

2. Description of the Prior Art

The need for an increased number of leads in the packaging of very Large Scale Integration (VLSI) devices has resulted in the development of chip carriers which utilize terminals on four sides of the package instead of the conventional two sided Dual In-Line packaging. It has also resulted in the development of pin grid arrays in which a plurality of rows of pins are arranged in an array, for example, with orthogonal spacing. This latter type of packaging is preferred when the pin density approaches 100 or more.

Pin grid array packages usually utilize multilayer ceramics or printed circuit (PC) boards. The costs associated with the use of multilayer ceramics as well as the superior conductivity of the copper traces used in PC boards favor the use of PC board technology for such packages. PC board packaging technology has long been used in watches and video game modules. In such applications, the integrated circuit die is directly attached onto a polymer-impregnated fiberglass board (PC board) with a conductive bonding material, e.g., a silver-filled epoxy resin, wirebonded out to the copper circuit traces on the PC board, and then encapsulated, for example, with an epoxy or silicone resin. Mounting pins to the board, either by a pressfit or by soldering in place, creates a simple PC board type Pin Grid Array package.

However, many VLSI devices generate considerable heat, necessitating the use of heat dissipation devices such as heat sinks. In PC technology, this can involve cutting out a central hole in the board, mounting a copper slug in the hole, and then bonding the chip directly to the slug. Such a package, when utilized in a cavity-down configuration where the heat can transfer more easily to the air flowing over the package, can dissipate heat more efficiently than an equivalent ceramic package. However, while the use of a copper slug in a PC board package does dissipate heat well, the thermal mismatch between the copper and the silicon substrate of the integrated circuit die bonded thereto can cause damage to the die.

An alternative form of heat dissipation utilizes heat pipes comprising holes in the PC board which are plated to provide a heat path between the metallization on one side of the PC board to which the integrated circuit die is attached and a metallized pad on the opposite side of the PC board. This type of structure is less costly and more reliable than the use of a copper slug.

However, such a heat pipe arrangement can create a moisture path to the die if the hole is not filled up prior to encapsulation. Therefore, heat pipe arrangements are more advantageously used in multilayer laminates where the die attach metallization extends between the layers or laminates and the plated holes extend through only one laminate which is then bonded to the other laminate to which the die is mounted with the metallization between the laminates thus creating blind holes. While such an arrangement solves the problem of possible moisture conduction to the die through the heat pipes, it complicates the manufacturing process by requiring two separate plating steps; the first to plate the heat pipes prior to laminating, and the other to plate the holes for the pins. Plating the holes for the pins must be done after the lamination step since the holes for the pins are usually not drilled until after lamination to avoid problems of misregistry which could occur if the holes in each layer or laminate were drilled separately prior to lamination.

Another problem encountered by the prior art relates to outgassing from the ragged edges or laminate adhesive exposed when the cavity to mount the die is punched out. Such outgassing can interfere with subsequent encapsulation of the package. This exposed area could be effectively sealed off by plating. However, the use of electroless copper plating techniques require the surface of the PC board to be very accurately masked off to prevent plating of the surface which could, in turn, short out all the wire traces previously patterned on the surface. One prior art approach to this was to provide a photoresist mask over the entire surface prior to punching out or routing the die cavity. This, of course, provides the desired mask right up to the edge of the die and thereby permits plating (and sealing) of the sidewalls exposed by the punching step.

This solution to the problem of outgassing, however, rules out the use of heat pipes in a multilayer laminate structure since the heat of lamination could damage the photoresist mask which could, in turn, have a deleterious effect on the yield due to the need for a second plating step after lamination of the layers to plate the holes for the pins as discussed earlier.

Thus, in the prior art constructions of PC board packaging, one had to either live with the problem of outgassing—by not plating and sealing the punched out cavity walls of the laminate—or with the problem of thermal mismatch between the copper slug heat sink and the integrated circuit die if one did plate the cavity walls since the heat pipe approach could then not be utilized.

It would, therefore, be very desirable if one could construct a PC board package for integrated circuit dies having plated cavity walls to prevent outgassing and yet utilize a multilayer heat pipe type heat dissipation system.

SUMMARY OF THE INVENTION

It is, therefore, an object of this invention to provide an improved PC board package for one or more integrated circuit dies.

It is another object of this invention to provide an improved PC board package for one or more integrated circuit dies having plated cavity walls to prevent outgassing from portions of the PC board exposed when forming the cavity.

It is yet another object of this invention to provide an improved PC board package for one or more integrated circuit dies having a multilayer heat pipe structure for dissipating heat generated by an integrated circuit die and plated cavity walls to prevent outgassing from portions of the PC board exposed when forming the cavity.

It is a further object of this invention to provide an improved PC board package for one or more integrated circuit dies having a multilayer heat pipe structure for dissipating heat and plated cavity walls wherein a single plating step is used to initially plate the cavity walls and the heat pipe walls as well as the walls of the holes for mounting the pins of the package when a pin grid array is used.

It is yet a further object of this invention to provide an improved PC board package for one or more integrated circuit dies having a multilayer heat pipe structure for dissipating heat and plated cavity walls wherein a single plating step is used to initially plate the cavity walls and the heat pipe walls, and the surface of the laminate is masked after laminating the layers to prevent plating of the surface.

It is a still further object of this invention to provide an improved PC board package for one or more integrated circuit dies having a multilayer heat pipe structure for dissipating heat and plated cavity walls wherein a single plating step is used to initially plate the cavity walls and the heat pipe walls, and the surface of the laminate is masked after laminating the layers by applying a dry photoresist layer over the surface of the laminate and then exposing the photoresist by passing light through the mask located over the cavity and reflecting this light back to the photoresist from a metallized surface at the bottom of the cavity to precisely expose, from the backside, only that portion of the photoresist extending over the cavity.

These and other objects of the invention will be apparent from the description of the invention and the accompanying drawings.

In accordance with the invention, an improved PC board package for one or more integrated circuit dies is provided having a multilayer heat pipe structure for dissipating heat generated by an integrated circuit die and plated cavity walls to prevent outgassing from portions of the PC board exposed when forming the cavity. In accordance with a preferred method of constructing the package, the heat pipes and cavity walls, as well as holes for the pins when a pin grid array is used, are simultaneously plated and a dry photoresist is placed over the cavity and exposed from the backside by reflecting light, passed into the cavity though the photoresist, from a metallized layer at the bottom of the cavity to provide a protective mask over the surface of the PC board adjacent the cavity during the plating step.

BRIEF DESCRIPTION OF THE DRAWINGS

FIG. 1 is a vertical cross section of one embodiment of the package of the invention.

FIG. 2 is a fragmentary vertical cross section view of another portion of the package of FIG. 1.

FIG. 4 is a vertical cross section of the top layer or laminate of the package.

FIG. 5 is a vertical cross section view of the lower layer or laminate of the package.

FIG. 6 is a vertical cross section view in exploded form showing the two laminate layers and the resin sheet used to bond the layers together.

FIG. 7 is a vertical cross sectional view of the two layer composite after bonding with the dry photoresist on the upper surface.

FIG. 8 is a vertical cross section view showing exposure of the rear surface of the photoresist on the upper surface of the composite.

FIG. 9 is a vertical cross section view of the composite during the plating step.

DESCRIPTION OF THE PREFERRED EMBODIMENT

Referring now to FIG. 1, one embodiment of the novel package of the invention is shown comprising a first laminate or PC board 10 and a second laminate or PC board 30 which have been bonded together to form a two layer composite.

The term "composite", as used herein, is intended to define multiple PC board layers, while the term "laminate", as used herein, is intended to define a single PC board. It is understood, of course, that the laminate material comprising each PC board actually comprises a multilayer structure of resin and fiberglass reinforcements which have been bonded together by the manufacturer of the PC board.

Figure 3:
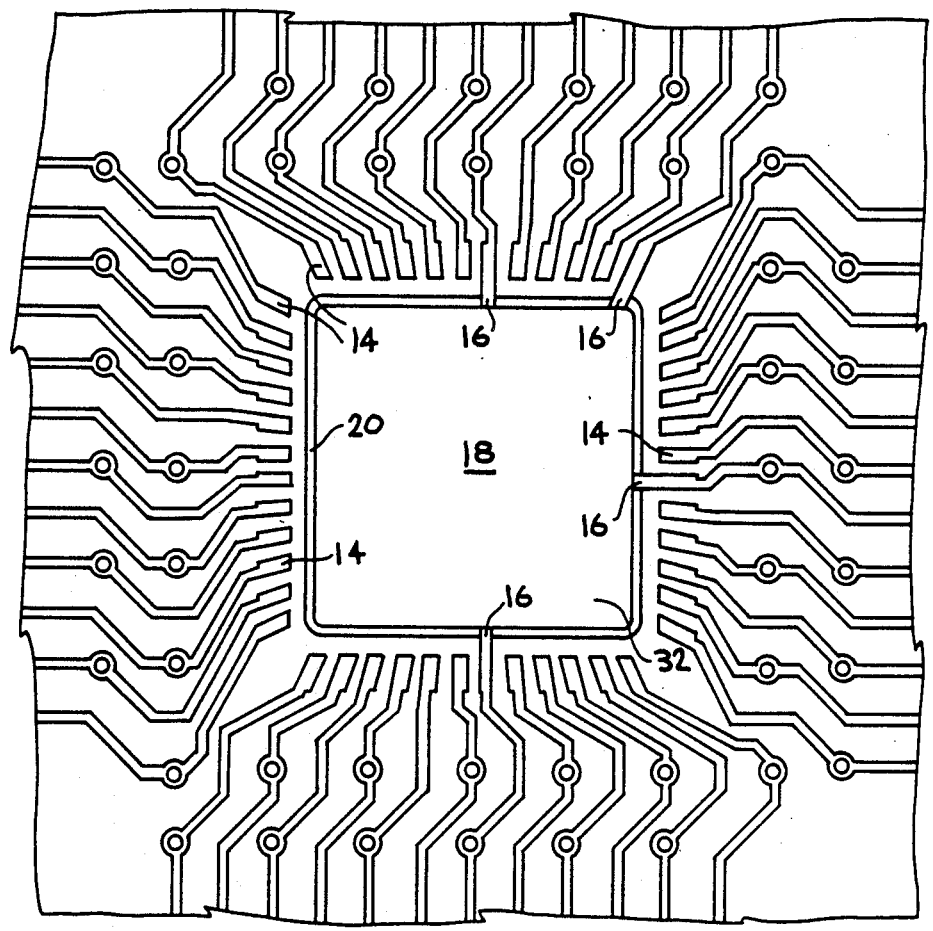
FIG. 3 is a top view of a portion of the package of FIG. 1.

The upper surface of laminate 10 is clad with a conductive layer of copper 12 of approximately 0.0007" thickness which has been patterned to form the circuit traces 14 and 16 (FIG. 3). Laminate 10 also has one or more large cavities 18, e.g. 0.475" by 0.475", cut out to permit installation of one or more integrated circuit dies therein. The lower laminate 30 is clad on one side with a first conductive copper layer 32 of approximately 0.0028" thickness and on the other side with a second copper layer 34 of approximately 0.0028" thickness. A portion of layer 32 forms the bottom of cavity 18 after the two laminates have been bonded together. Laminate 30 is also provided with heat pipes 36 comprising bores of about 0.045" diameter which are subsequently plated at 38 to provide a continuous heat path from upper conductive layer 32 to lower conductive layer 34. A heat sink (not shown) may be attached to a portion of the surface of lower layer 34.

After the two laminates are bonded together (as will be described in more detail below), holes 42 are drilled through both laminates and then plated to receive pins 44 which provide electrical communication to the respective wire traces on the laminates.

Upper laminate 10 may be further provided with a resin dam 50 which assists in retaining an encapsulating resin which can be used to seal the integrated circuit die after it is bonded to the upper surface of copper layer 32 and wire bonded out to circuit traces 12 or 14 on PC board or laminate 10.

It will be noted that the laminate edges 26, where laminate 10 was cut to form cavity 18, have been completely sealed by a metal coating 20 which, in accordance with an important aspect of the invention, extends flush with the upper surface of laminate 10. In FIG. 1, metal coating 20 is shown as not in contact with patterned copper layer 12. However, as shown at 24 in FIG. 2, contact may be made, if desired, between metal coating 20 and selected traces comprising portions of layer 12 to provide electrical contact as well as a heat path from the back side of the die due to the contact between coating 20 and copper layer 32 to which the back of the die is subsequently bonded. This configuration is shown in FIG. 3 which is a top view showing traces 14 forming a portion of layer 12 after patterning. It will be noted that several traces, denoted as 16, extend to the edge of cavity 18 to form electrical contact with cavity wall coating 20 to thereby communicate with layer 32 at the bottom of cavity 18.

Turning now to FIGS. 4-9, the method for producing the package of the invention will be described. As shown in FIG. 4, PC board 10 is provided with a 0.0007" thick cladding or layer 12 of copper on its upper surface. PC board 10 typically comprises a 0.020" thick commercially available laminate of a high temperature modified epoxy or polyimide. Laminate 10 is masked and etched to form the traces and wire bond pads from copper layer 12. One or more central cavities 18 are then punched or routed out through the PC board. Alternatively, the cutting away to form cavity 18 may be conducted first followed by masking and etching of copper layer 12. The lower PC board 30, which may comprise the same type of laminate as PC board 10, is clad with a 0.0014" thick copper layer on each side of the PC board comprising an upper copper layer 32 and a lower copper layer 34. Heat pipe holes, having a diameter of about 0.045" are drilled through PC board 30 to form the heat pipe openings shown at 36. Both copper layers 32 and 34 are then masked and etched to form circuit traces on both sides of PC board 30.

The two PC boards may now be bonded together to form composite 80 (FIG. 7). As shown in FIG. 6, a B-stage adhesive material or "prepreg" 40 is used, which may comprise an acrylic or epoxy resin, to bond PC board 10 to PC board 30. Prior to the bonding, however, holes are punched out of prepreg 40 corresponding, respectively, to cavity 18 and heat pipes 36. The heat pipe holes are punched out of prepreg 40 to insure that none of the adhesive will be in the heat pipe holes which could otherwise interfere with contact between the subsequently plated sidewalls of the heat pipes and the copper layer 32. A hole corresponding to the dimensions of cavity 18 is also punched out of prepreg 40 to insure that no adhesive will be on the exposed surface of copper layer 32 in cavity 18 after the bonding operation since this could both interfere with subsequent exposure of the photomask, as will be described, and eventual bonding of the integrated circuit die to copper layer 32.

FIG. 7 shows bonded composite 80 after PC board 10 and PC board 30 have been bonded together to form the composite. The bonding is typically accomplished, for example, when prepreg 40 comprises an epoxy resin, by heating the package to a temperature of 350° F. for 2 hours at 250 psi to cure the B-stage epoxy resin adhesive material.

As shown in FIG. 7, holes have been drilled at 42 through composite 80, after bonding together of PC boards 10 and 30, for the eventual mounting of pins 44. After composite 80 has been formed and holes 42 drilled, a dry positive photoresist material 60 is placed over the top of the composite. Photoresist 60 is exposed, by contact printing using artwork film 66, having an opening 68 therein, which is placed directly in contact with photoresist layer 60, and then exposing the structure to light from a light source 70. As shown by direct light path 72 and reflected light path 74, the light, shining along path 72, passes through opening 68 in artwork film 66 and through photoresist layer 60 to reflect off copper metal surface 32. The light is then reflected back along path 74 to expose the underside or backside portion of photoresist layer 60 to thus accurately expose only that portion of the photoresist layer 60 which extends over cavity 18. If desired, a small hole may be made in photoresist layer 60, for example, with a hot NiCr wire, to pass further light to copper metal surface 32 for reflectance back to the underside of photoresist 60.

The use of dry photoresist material 60, which is stretched across cavity 18 and then exposed from the backside, forms a particularly novel portion of the invention. By exposing the backside of photoresist 60, the protective mask, formed by subsequent development of photoresist 60, can be made to cover all of the top surface of layer 12 on composite 100 much more accurately than if an exposure mask was used in registry with cavity 18. This accurate mask then permits plating and sealing of the edges of laminate 10 exposed when punching out cavity 18. Thus, in accordance with the invention, a multilaminate structure, having a cavity with plated sidewalls in one laminate and heat pipes in a second laminate may be provided. Thus, unlike the prior art, elimination of both the problems of outgassing and thermal mismatch of heat sinks bonded directly to integrated circuit dies are possible.

Because the portion of the photoresist layer which is exposed to light will be subsequently developed and removed, positive photoresist material should be used for layer 60. After the exposure, the photoresist film is developed to remove the exposed portion leaving protective photoresist over the copper traces which have been patterned from copper layer 12 on the upper surface of composite 80.

Composite 80 is now subjected to a conventional electroless copper plating process, as is well known in the art, to coat the sidewalls of holes 42 for pins 44, the heat pipes 36, and the sidewalls of cavity 18 to respectively form coated areas 46 in holes 42, coated area 38 on the sidewalls of heat pipes 36, and plated material 20 on the sidewalls of cavity 18. After the electroless plating step, composite 80 may be electroplated with copper to deposit copper over the previously deposited copper to provide a more dense, low porosity, copper layer which will seal the exposed sidewalls of the laminate or PC boards 10 and 30 to thereby prevent subsequent outgassing. Photoresist layer 60 may now be stripped from the composite (alternatively the photoresist material could be stripped prior to the copper electroplating step).

It is preferred to remove photoresist 60, which will also cover shorting bars around the periphery of the top surface, to facilitate plating of the traces on copper layer 12 as well.

Composite 80 is now cleaned and rinsed, to remove the chemical etchants, and dried. A solder mask may then be applied comprising a screen print of epoxy to mask off all traces that are not to be plated any further. The areas on bottom copper layer 34 are also optionally masked off if an optional heat sink is to be attached thereto. The composite is then electronickel plated and electrogold plated on all exposed metal areas. Pins 44 are then inserted into holes 42. As shown in FIG. 1, a resin dam 50 may be glued around cavity 18 to facilitate subsequent encapsulation of the integrated circuit die after its attachment to the package.

It should be noted that while a pin grid array having two rows of pins have been shown, the use of a single row of pins or multiple rows of pins will be optional depending on the number of leads to be attached to the die. Furthermore, the method of the invention may be used in conjunction with the formation of other types of packages such as, for example, leadless chip carriers or chip paks, and dual in-line packages.

Figure 10:
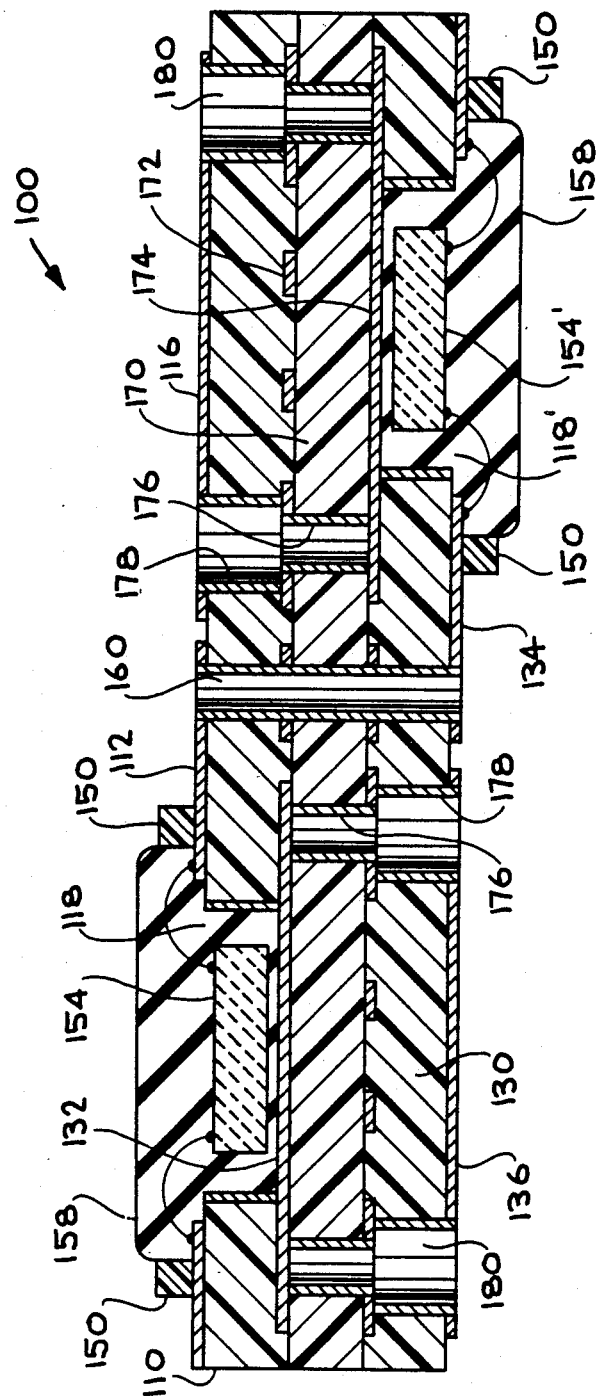
FIG. 10 is a vertical cross section of another embodiment of the invention.

Turning now to FIG. 10, another embodiment of the invention is illustrated comprising composite 100. In this embodiment, three laminates or PC boards are used to form composite 100, thus providing four conductive layers from which the circuit traces may be formed. The upper PC board 110 may contain one or more cavities 118 in which an integrated circuit die 154 is mounted, for example, by bonding to metal layer 132. Die 154 is illustrated as surrounded by encapsulant 158 which is retained during curing by resin dam 150.

Composite 100 is further provided with heat pipes 180 which, unlike the previously described heat pipes, pass through two laminates and, therefore, comprise a smaller diameter inner bore and a larger diameter outer bore as will be described.

Lower PC board 130 is also shown with a cavity 118' into which another integrated circuit die 154' has been mounted and encapsulated.

To form composite 100, a PC board 170, which will eventually become the middle laminate of composite 100, is provided with 0.0028" copper layers 172 and 174. PC board 170 is masked to form the desired circuit traces from layers 172 and 174 and then drilled to form holes 176 which will eventually become the smaller diameter inner bores for heat pipes 180.

PC board 110, having copper layer 112 thereon, and PC board 130 with copper layer 134 thereon are respectively masked to form the wire traces from copper layers 112 and 134 and then drilled or routed to form cavities 118 and 118' as well as the larger diameter bores 178 for formation of heat pipes 180.

The three PC boards are then bonded together, similarly to the bonding previously described, to form composite 100. The purpose of forming the outer bores 178 of heat pipes 180 of larger diameter than inner bores 176 is to avoid misregistration of the holes when forming the composite. Subsequent plating of the walls of holes 176 and 178 will provide a continuous heat path through, respectively, either copper layer 112 or copper layer 134 which separates the two diameters.

After bonding the three PC board laminates together to form composite 100, both surfaces are covered with a positive photoresist and "thru" holes 160 are drilled through the laminates; and the photoresist layers, where desired. Then the photoresists are exposed to light using a contact printer to expose, by reflected light, the backside of the photoresist layers over cavities 118 or 118' as previously described with respect to FIG. 8. At the same time, masking for the heat pipe holes can also be done either using conventional masking techniques or by reflecting light from the copper layer at the bottom of each heat pipe cavity.

The exposed photoresists are then developed to provide accurate masking of the surfaces up to the edges of cavities 118 and 118'. The walls of cavities 118 and 118' and the walls of holes 176 and 178 are then plated with an electroless copper plating process to respectively seal the exposed edges of cavities 118 and 118' and to provide the heat conducting paths for heat pipes 180. The composite is then further plated as previously described.

However, in the processing of this embodiment, it is necessary to provide etchable shorting bars on the exposed copper layers 112 and 134 to facilitate connection to the wire traces for electroplating. If a single cavity package was utilized, these shorting bars could be located on the periphery of the PC board and simply trimmed away after processing. However, since the shorting bars for layer 112 may be positioned inside the periphery, the bars must be etched away after use.

However, if a heat-sink is to be attached to heat-sink pad 116 of copper layer 112 or heat-sink pad 136 of copper layer 134, these areas should not be electronickel and electrogold plated, but rather should be left bare to facilitate the adhesive attachment of the heat-sink. This, in turn, could cause difficulties in subsequent etching away of the shorting bars if the heat-sink pads were not protected from the copper etchant used to remove the shorting bars.

In accordance, therefore, with one aspect of the invention, the use of positive photoresist, wherein exposure to light depolymerizes the photoresist, permits the dual use of the same photoresist material to solve the above problem. After its use to mask off all but the cavity and the heat pipe holes, the remaining photoresist can be utilized a second time as a mask for the heat-sink pads by exposing and developing only the portion of the remaining photoresist layer (from the first exposure and development) over the shorting bars. The shorting bars are then etched away followed by removal of the photoresist layer.

Thus, the invention provides an improved PC board package using heat pipes, rather than a heat sink directly attached to the die, to dissipate the heat produced by the integrated circuit structure while also providing plating and sealing off of the sidewalls of the cavity to prevent outgassing from materials within the laminate layer upon subsequent encapsulation of the die mounted in the cavity. The formation of the package using a single initial plating step, to simultaneously plate the heat pipes and the sidewalls of the cavity at the same time (as well as also plating holes for pins if a pin grid array package is used) provides a more economic method for constructing the package of the invention. The sealing of the cavity sidewalls by accurate plating to the top surface of the composite and the simultaneous plating of cavity sidewalls and heat pipes, as well as holes for pins when pins are used, is made possible by the novel masking of the top surface and with a dry photoresist and backside exposure of the photoresist.

Having thus described the invention, what is claimed is:

1. In a method for producing a PC board package for one or more integrated circuit dies wherein one or more cavities are formed in a first PC board to receive said dies and heat pipes are formed in a second PC board prior to bonding said PC boards together to form a composite, the improvement which comprises:
    (a) applying a positive photoresist to the surface of said first PC board of the composite over said cavity;
    (b) exposing the back surface of said photoresist over said one or more cavities to light;
    (c) developing said photoresist to provide an accurate mask over the surface of said composite to the edge of said one or more cavities; and
    (d) simultaneously plating the walls of said heat pipes and the cavity walls.

2. The method of claim 1 wherein the surface of said first PC board to which said photoresist is applied is clad with a conductive metal layer and the method includes the further step of patterning said conductive layer prior to applying said photoresist thereto.

3. The method of claim 2 wherein said second PC board has a layer of metal clad on both surfaces thereon and said method further includes the step of patterning said metal layers on said second PC board.

4. The method of claim 3 wherein said metal layer clad on said surface of said second PC board bonded to said first PC board forms the bottom of said cavity and light used to expose the back side of said photoresist layer is reflected off said metal layer at the bottom of said cavity.

5. The method of claim 4 which includes the further steps of providing an opening in said photoresist layer over said cavity to admit light therethrough.

6. The method of claim 5 which includes the further step of providing a mask over said photoresist to shield said photoresist from light in at least those portions of said photoresist not over said cavity.

7. The method of claim 6 wherein said mask is placed in contact with said photoresist.

8. The method of claim 7 wherein said photoresist is a positive photoresist and only the portions of said photoresist exposed to light from the backside are removed by development of said photoresist.

9. The method of claim 7 which includes the further step of forming holes to receive pins in said composite after bonding said PC boards together and said plating step includes plating the walls of said holes for said pins.

10. The method of claim 4 wherein the plating of said walls of said heat pipes provides thermal communication between the metal cladding layer on one side of said second PC board and the metal cladding layer on the other side of said second PC board whereby heat emitted from an integrated circuit chip bonded to said metal cladding layer forming the bottom of said cavity will be transmitted to the metal cladding layer on the opposite side of said second PC board.

11. The method of claim 4 including the further steps of bonding to said second PC board a third PC board having one or more cavities therein; applying a photoresist to the surface of said third PC board over said one or more cavities therein; exposing to light the back surface of said photoresist over said one or more cavities; developing said photoresist to provide an accurate mask over the surface of said third PC board to the edge of said one or more cavities; and simultaneously plating the cavity walls while plating said heat pipes and said cavity walls in said first PC board.

12. The method of claim 11 which includes the further steps of forming holes for heat pipes to transmit heat from the bottom of said one or more cavities through the remaining layers in said composite to the opposite surface thereof and simultaneously plating said heat pipe holes when plating said cavity walls.

13. The method of claim 12 which further comprises forming said heat pipe holes using more than one diameter when the heat pipe passes through more than one layer to prevent heat transmission problems from misregistry of the holes in adjacent layers.

14. The method of claim 11 which includes the further step of exposing to light the portion of said photoresist over shorting bars on said PC board surface to permit selective removal of said shorting bars without removal of heat-sink pads on said surface whereby said positive photoresist layer can be used in at least two separate masking steps.

15. A method for constructing a PC board package for one or more integrated circuit dies, said PC board package characterized by the provision of plated side walls to seal the exposed cavity walls formed in a PC board adjacent the surface of said package, and heat pipes passing through a second PC board bonded to said PC board adjacent the surface of said package, said method comprising:
(a) forming at least one cavity in a first PC board having a conductive metal layer on a first surface thereof;
(b) forming holes for heat pipes in a second PC board having a conductive metal layer respectively on each surface thereof;
(c) bonding the opposite surface of said first PC board to the second PC board;
(d) attaching a dry photoresist layer to said conductive surface of said first PC board;
(e) exposing said photoresist to light through a mask in contact with said photoresist to permit light to pass through said opening and expose said photoresist from the backside by reflection of light from said first conductive layer on said second PC board forming the bottom of said cavity;
(f) developing said photoresist to remove the exposed portion; and
(g) simultaneously plating the sidewalls of said heat pipe holes and said cavity sidewalls to seal said cavity sidewalls to inhibit outgassing during subsequent encapsulation of an integrated circuit die in said cavity.

* * * * *